United States Patent
Lee et al.

(10) Patent No.: US 7,733,147 B2
(45) Date of Patent: Jun. 8, 2010

(54) DELAY CIRCUIT OF DELAY LOCKED LOOP HAVING SINGLE AND DUAL DELAY LINES AND CONTROL METHOD OF THE SAME

(75) Inventors: Hyun-Woo Lee, Ichon (KR); Won-Joo Yun, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/172,887

(22) Filed: Jul. 14, 2008

(65) Prior Publication Data

US 2009/0146709 A1 Jun. 11, 2009

(30) Foreign Application Priority Data

Dec. 11, 2007 (KR) ........................ 10-2007-0128301

(51) Int. Cl.
*H03H 11/26* (2006.01)
(52) U.S. Cl. .................. 327/261; 327/158; 327/270; 327/271
(58) Field of Classification Search ................ 327/156, 327/158, 159, 261–262, 270–272, 276–278
See application file for complete search history.

(56) References Cited

U.S. PATENT DOCUMENTS

| | | | |
|---|---|---|---|
| 6,836,166 B2 * | 12/2004 | Lin et al. ................... | 327/158 |
| 7,016,452 B2 | 3/2006 | Partsch et al. | |
| 7,161,397 B2 * | 1/2007 | Lee et al. ................... | 327/149 |
| 7,184,509 B2 * | 2/2007 | Cho et al. ................... | 375/373 |
| 7,236,028 B1 | 6/2007 | Choi | |
| 7,282,974 B2 * | 10/2007 | Lee ............................ | 327/158 |
| 7,285,997 B2 | 10/2007 | Haerle et al. | |
| 7,336,111 B2 | 2/2008 | Lin et al. | |

FOREIGN PATENT DOCUMENTS

| | | |
|---|---|---|
| KR | 1020030078129 | 10/2003 |
| KR | 1020060082498 | 7/2006 |
| KR | 1020070109683 A | 11/2007 |

* cited by examiner

*Primary Examiner*—An T Luu
(74) *Attorney, Agent, or Firm*—Baker & McKenzie LLP

(57) ABSTRACT

A delay circuit in a delay locked loop includes a first delay circuit unit for delaying an input signal using a single delay line in response to first control signals and then outputting a first delay signal and a second delay signal, and a second delay circuit unit for delaying the first delay signal and the second delay signal by delay time, which is correspondent to second control signals and third control signals, using a dual delay line and then outputting a third delay signal and a fourth delay signal.

12 Claims, 6 Drawing Sheets

DELAY CIRCUIT OF DELAY LOCKED LOOP HAVING SINGLE AND DUAL DELAY LINES AND CONTROL METHOD OF THE SAME

CROSS-REFERENCES TO RELATED APPLICATION

The present application claims priority under 35 U.S.C. 119(a) to Korean application number 10-2007-0128301, filed on Dec. 11, 2007, in the Korean Intellectual Property Office, which is incorporated by reference in its entirety as if set forth in full.

BACKGROUND

1. Technical Field

The embodiments described herein relate to a semiconductor circuit technology and, more particularly, to a delay circuit of a delay locked loop in a semiconductor integrated circuit and a method for controlling the same.

2. Related Art

A delay locked loop (DLL) is a circuit for synchronizing a clock signal supplied from an external circuit with a clock signal used in an internal circuit of a conventional semiconductor memory apparatus. A conventional delay locked loop includes a delay circuit. The delay circuit changes a delay time of a clock signal, which is input from the external circuit, in response to a control signal, which is generated within the delay locked loop, and outputs the delayed clock signal. Conventional delay circuits are implemented by a dual delay line or a single delay line.

As shown in FIG. 1, a conventional delay circuit includes a dual delay line (1 and 2) and a phase mixer 3.

The dual delay line (1 and 2) delays and outputs a clock signal in response to control signals generated by shift registers in a delay locked loop. The delay time is determined by the number of unit delayers activated by the control signals.

The phase mixer 3 mixes two signals that are output by the dual delay line (1 and 2) to output an output signal 'CLK_out'.

A driving circuit is required to drive signals input onto the two delay lines. However, a conventional driving circuit consumes a large amount of current and causes a large amount of noise. In addition, since the driving circuit occupies a large area, it limits integration.

Referring to FIG. 2, a delay circuit using a single delay line includes a plurality of delayers 210 to 210 to 214 and a plurality of switches 215 to 219. The reference numeral 220 designate a multiplexer and 230 a phase mixer. U.S. Pat. No. 7,016,452 discloses a conventional delay circuit using the single delay line.

A delay circuit using the single delay line, such as that disclosed in U.S. Pat. No. 7,106,452, needs a large number of switches 215 to 219 to control the outputs of the plurality of delayers 210 to 210 to 214. As a result, the circuit area becomes is increased and the circuit is unstable in coupling capacitance. In the delay circuit using the single delay line, the most critical issue is to increase the generation of signal distortion and then it is difficult to operate in a high-frequency.

SUMMARY

A delay circuit of a delay locked loop capable of stably operating in low and high frequency with a small-sized circuit area.

According to one aspect, a delay circuit in a delay locked loop comprises a first delay circuit unit for delaying an input signal using a single delay line in response to first control signals and then outputting a first delay signal and a second delay signal, and a second delay circuit unit for delaying the first delay signal and the second delay signal by a delay time, which corresponds to second control signals and third control signals, using a dual delay line and then outputting a third delay signal and a fourth delay signal.

According to another aspect, a method for controlling a delay circuit in a delay locked loop, wherein the delay circuit includes a first delay circuit unit and a second delay circuit unit, the method comprising controlling the delay circuit to fix a delay time of one of the first delay circuit unit and the second delay circuit unit, and executing a delay locking operation by varying a delay time of the other of the first delay circuit unit and the second delay circuit unit.

According to still another aspect, a method for controlling a delay circuit in a delay locked loop, wherein the delay circuit includes a first delay circuit unit and a second delay circuit unit, the method comprising executing a delay locking operation by varying a delay time of the second delay circuit unit in a state where a delay time of the first circuit unit is fixed, and varying the delay time of the first circuit unit when a delay is not locked by a maximum delay time of the second delay circuit unit.

According to still another aspect, a method for controlling a delay circuit in a delay locked loop, wherein the delay circuit includes a first delay circuit unit for outputting a first delay signal and a second delay signal by delaying an input signal and a second delay circuit unit for outputting a third delay signal and a fourth delay signal by delaying the first delay signal and the second delay signal, the method comprising outputting the first delay signal and the second delay signal in a state where a delay time of the first delay circuit unit is fixed, executing a delay locking operation by varying a delay time of the second delay circuit unit to output the third delay signal and the fourth delay signal, and varying the delay time of the first circuit unit when a delay is not locked by a maximum delay time of the second delay circuit unit.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 3:
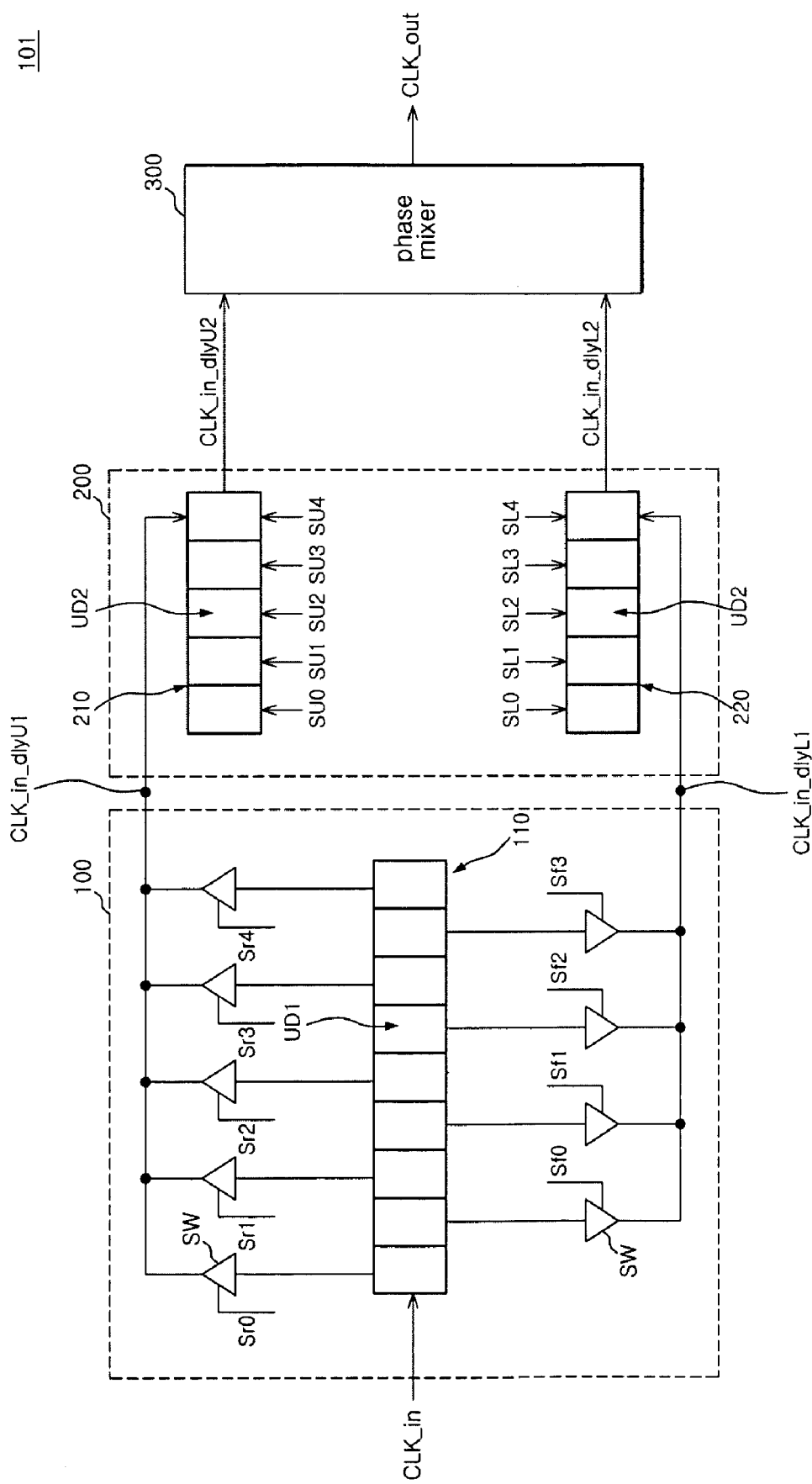
FIG. 3 is a block diagram illustrating a delay circuit of a delay locked loop according to one embodiment.

FIG. 3 is a diagram illustrating a delay circuit 101 according to one embodiment. As shown in FIG. 3, the delay circuit 101, which can be included in a delay locked loop, can include a first delay circuit unit 100, a second delay circuit unit 200, and a phase mixer 300.

The first delay circuit unit 100 can be configured to output a first delay signal 'CLK_in_dlyU1' and a second delay signal 'CLK_in_dlyL1', which are generated by delaying an input signal 'CLK_in' in response to first control signals 'Sr0', 'Sf0', . . . , 'Sf3' and 'Sr4'. The delay time of the first delay signal 'CLK_in_dlyU1' can be different from that of the second delay signal 'CLK_in_dlyL1'.

The first delay circuit unit 100 can include a single delay line 110, which can have a plurality of unit delayers UD1 and a plurality of switches SW coupled to the plurality of unit delayers UD1, respectively.

The plurality of switches SW can be configured to output the first delay signal 'CLK_in_dlyU1' and the second delay signal 'CLK_in_dlyL1' using output signals of the first unit delayers UD1, which are respectively coupled to the switches SW, in response to the first control signals 'Sr0', 'Sf0', . . . , 'Sf3' and 'Sr4'.

The first delay signal 'CLK_in_dlyU1' can be output through a switch SW, which is turned on in respond to the first control signals 'Sr0', 'Sr1'. 'Sr2', 'Sr3' and 'Sr4', of the plurality of switches SW.

The second delay signal 'CLK_in_dlyL1' can be output through a switch SW, which can be turned on in respond to the first control signals 'Sf0', 'Sf1'. 'Sf2' and 'Sf3', of the plurality of switches SW.

The second delay circuit unit 200 can be configured to output a third delay signal 'CLK_in_dlyU2' and a fourth delay signal 'CLK_in_dlyL2' by delaying the output signal of the first delay circuit unit 100 for a predetermined time corresponding to second control signals 'SU0' to 'SU4' and third control signals 'SL0' to 'SL4'.

The second delay circuit unit 200 can include a dual delay line which has a first delay line 210 and a second delay line 220. The first delay line 210 can have the same configuration as the second delay line 220 and each of the first and second delay lines 210 and 220 can have a plurality of unit delayers US2.

Figure 4:
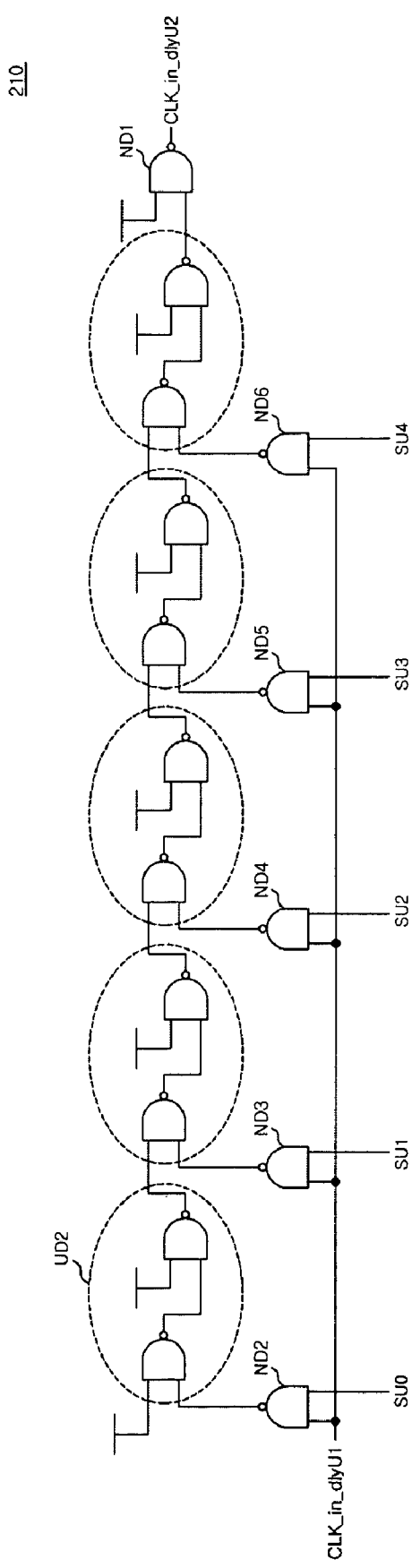
FIG. 4 is a circuit diagram illustrating one delay line of a dual delay line of the circuit of FIG. 3.

As shown in FIG. 4, the first delay line 210 can include the plurality of unit delayers US2 and a plurality of NAND gates ND1 to ND6.

While the second unit delayers UD2 can be implemented in a variety of ways, FIG. 4 illustrated an example implementation comprising a combination of the two-NAND gates.

The plurality of NAND gates ND2 to ND6, which receive the first delay signal 'CLK_in_dlyU1' input the received first delay signal 'CLK_in_dlyU1' into the second unit delayers UD2 in response to second control signals 'SU0' to 'SU4'. The NAND gate ND1 inverts an output of the second unit delayer UD2 at the final stage so that the third delay signal 'CLK_in_dlyU2' can be in phase with the first delay signal 'CLK_in_dlyU1'. The third delay signal 'CLK_in_dlyU2' can be output with a delay time which is taken from a timing the first delay signal 'CLK_in_dlyU1' can be input into the second unit delayer UD2 at the first stage when the output of the unit delayer UD2 is output at the final stage.

The phase mixer 300 can be configured to output an output signal 'CLK_out' by mixing the third and fourth delay signals 'CLK_in_dlyU2' and 'CLK_in_dlyL2'.

There can be a delay time between the first delay signal 'CLK_in_dlyU1' and the second delay signal 'CLK_in_dlyL1', and the delay time can correspond to at least one unit delayer UD1.

Generally, the delay locked loop 101 can include a phase detector to generate a detection signal by detecting a phase difference between an input signal 'CLK_in' and the output signal 'CLK_out', a counter to output count signals in response to the detection signal, and a decoder to generate a control signal for the delay circuit (single delay line or dual delay line) by decoding the counter signals. The first control signals 'Sr0', 'Sf0', . . . , 'Sf3' and 'Sr4' and the second control signals 'SU0' to 'SU4' to control the first delay circuit unit 100 and the second delay circuit unit 200 can be generated by using this decoder of the delay locked loop.

The number and size of the first unit delayers UD1 and the second unit delayers UD2 can be different and can be determined based on the requirements of a particular implementation, such as the circuit design and the operating frequency.

A delay circuit according 101 can be a hybrid type design. That is, the first delay circuit unit 100 having the single delay line 110 can be provided at an input side and the second delay circuit unit 200 having the dual delay line of the first and second delay lines 210 and 220 can be provided at an output side.

A conventional delay circuit using only the dual delay line needs a large amount of current to drive the input signal 'CLK_in' input into two delay lines and causes a large amount of noise. However, a delay circuit configured as described herein can reduce the current consumption and noise by providing the first delay circuit unit 100 having the single delay line 110 to the input side. Since the input signal 'CLK_in' is provided to only the single delay line, the current consumption and the noise of the driver, which drives the input signal 'CLK_in', can be reduced.

Further, a conventional delay circuit using only the single delay line includes a large number of switches to multiplex the output signal. Accordingly, since a conventional delay circuit using only the single delay line causes a signal distortion, it is difficult to operate in the high frequency. However, a delay circuit configured according to the embodiments described herein can improve the high-frequency characteristics by providing the dual delay line (210 and 220), which does not need the switches for multiplexing the output signal, to the output side.

Figure 1:
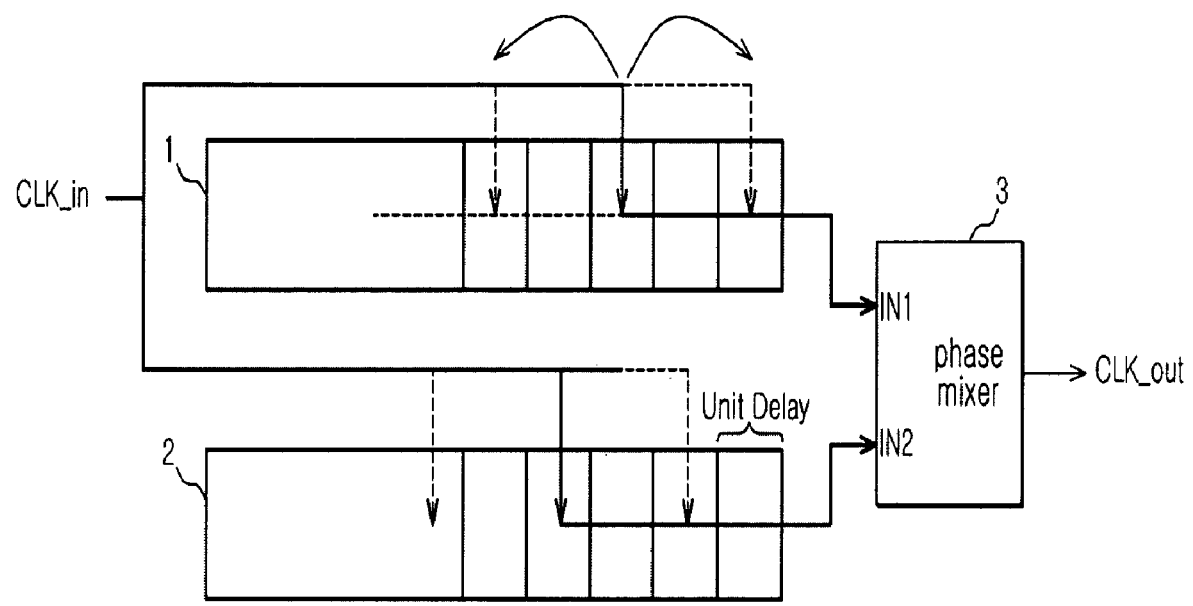
FIG. 1 is a block diagram illustrating a conventional delay circuit using a dual delay line.

A delay circuit configured as described herein can be a hybrid-type delay circuit having two kinds of delay lines. The single delay line 110 can be designed with the reduction of the number of unit delayers, as compared with the conventional single line. Accordingly, the number of switches to transfer the output signals of the unit delayers is also reduced. The dual delay line (210 and 220) can be designed with the reduced number of unit delayers, as compared with the conventional dual delay line of FIG. 1.

Figure 2:
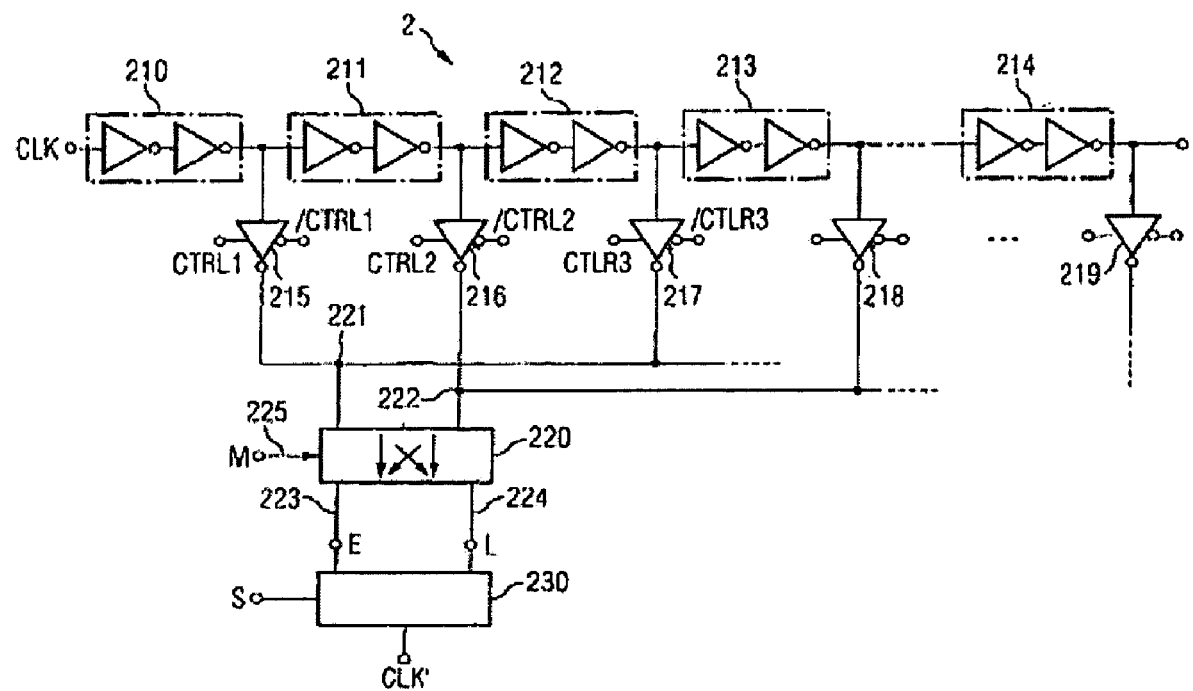
FIG. 2 is a block diagram illustrating another conventional delay circuit using a single delay line.

Even if a delay circuit configured as described herein is configured to have two kinds of delay lines, the total area is reduced, as compared with the conventional delay line of FIG. 2. Since the number of switches in the first delay circuit unit 100 is reduced, the degradation of capacitance characteristics, which is caused by the plurality of switches, can also be overcome.

A method for controlling the delay circuit of the delay locked loop configured as described herein will now be described in detail.

The delay circuit 101 makes it possible to selectively operate the first delay circuit unit 100 or the second delay circuit unit 200 using the first control signals 'Sr0', 'Sf0', . . . , 'Sf3' and 'Sr4', the second control signals 'SU0' to 'SU4' and the third control signals 'SL0' to 'SL4'.

As mentioned above, the values of the first control signals 'Sr0', 'Sf0', . . . , 'Sf3' and 'Sr4', the second control signals 'SU0' to 'SU4' and the third control signals 'SL0' to 'SL4' are generated and adjusted according to the internal construction of the delay locked loop.

In case that only the delay circuit unit 100 operates, the second control signals SU0 to SU4 and the third control signals SL0 to SL4 are fixed to a specific value and the first control signals 'Sr0', 'Sf0', ..., 'Sf3' and 'Sr4' are varied.

The values of the first control signals 'Sr0', 'Sf0', ..., 'Sf3' and 'Sr4' are adjusted until the delay locking operation has been completed.

The single delay 110 delays the input signal 'CLK_in' by a delay time which is varied according to the values of the first control signals 'Sr0', 'Sf0', ..., 'Sf3' and 'Sr4' and then outputs the first delay signal 'CLK_in_dlyU1' and the second delay signal 'CLK_in_dlyL1' to the dual delay line (210 and 220).

Since the second control signals 'SU0' to 'SU4' and the third control signals SL0 to SL4 are fixed to a specific value, the dual delay line (210 and 220) delays the first delay signal 'CLK_in_dlyU1' and the second delay signal 'CLK_in_dlyL1' by a specific delay time and then outputs the third delay signal 'CLK_in_dlyU2' and the fourth delay signal 'CLK_in_dlyL2' to the phase mixer 300.

In case that only the second delay circuit unit 200 operates, the first control signals 'Sr0', 'Sf0', ..., 'Sf3' and 'Sr4' are fixed to a specific value and the second control signals 'SU0' to 'SU4' and the third control signals 'SL0 to 'SL4' are varied.

Since first control signals 'Sr0', 'Sf0', ..., 'Sf3' and 'Sr4' are fixed to a specific value, the single delay line 110 delays the input signal 'CLK_in' by a specific delay time and then outputs the first delay signal 'CLK_in_dlyU1' and the second delay signal 'CLK_in_dlyL1' to the dual delay line (210 and 220).

The values of the second control signals 'SU0' to 'SU4' and the third control signals 'SL0' to 'SL4' are adjusted until the delay locking operation has been completed.

Accordingly, the first and second delay circuit units 100 and 200 are controlled selectively or in batch processing so that different delay values can be provided.

The dual delay line (210 and 220) varies the delay time of the first delay signal 'CLK_in_dlyU1' and the second delay signal 'CLK_in_dlyL1' in response to the second control signals SU0 to SU4 and the third control signals SL0 to SL4 and then outputs the third delay signal 'CLK_in_dlyU2' and the fourth delay signal 'CLK_in_dlyL2' to the phase mixer 300.

Figure 5:
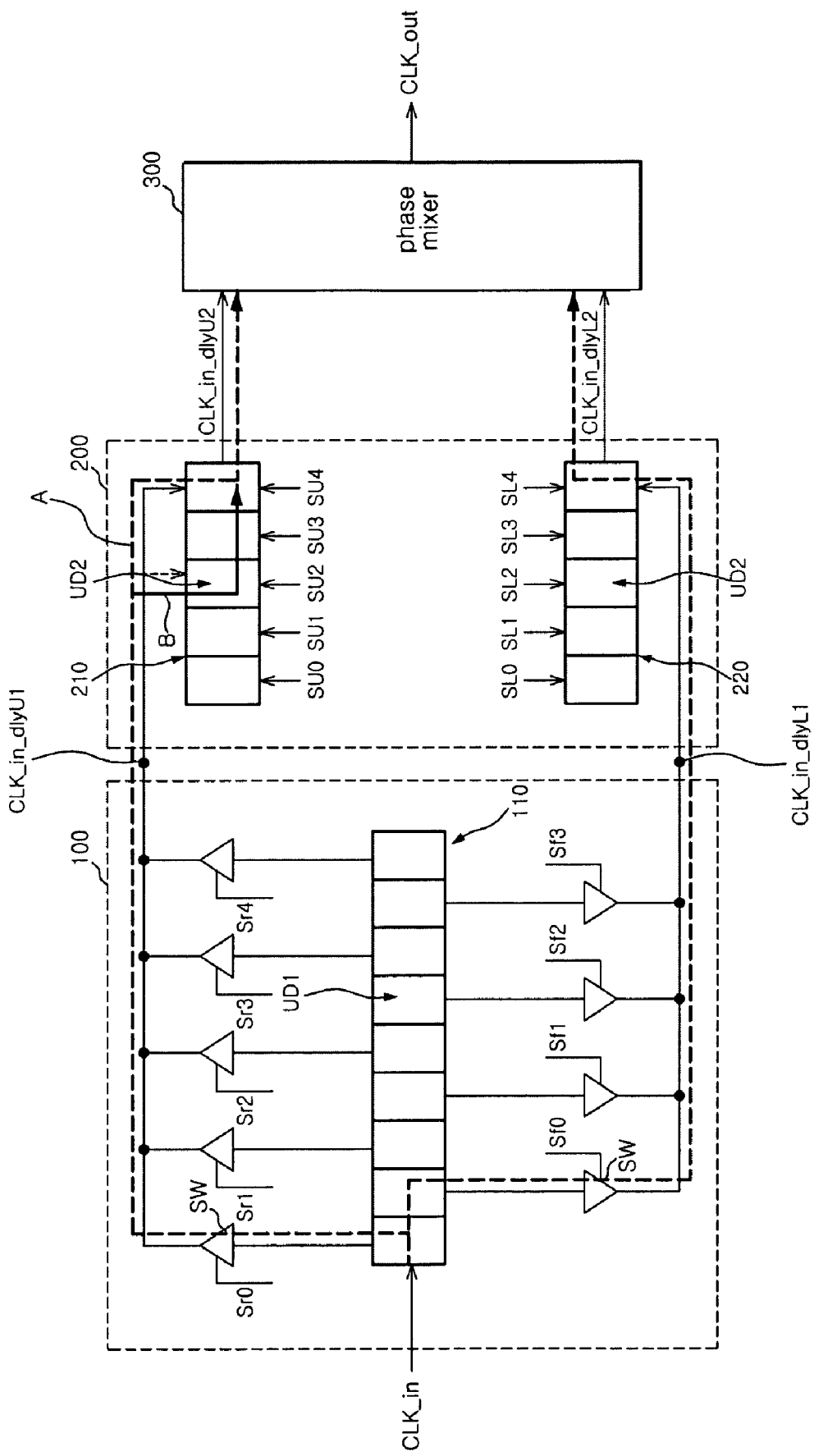
FIG. 5 is a block diagram illustrating a method for controlling the delay circuit of the delay locked loop of FIG. 3 according to one embodiment.

The case where only the second delay circuit unit 200 operates is shown in FIG. 5. Initially, the first delay circuit unit 100 outputs the first delay signal 'CLK_in_dlyU1' and the second delay signal 'CLK_in_dlyL1', by fixing the first control signals 'Sr0', 'Sf0', ..., 'Sf3' and 'Sr4' to a specific delay value and delaying the input signal 'CLK_in' by a specific delay time.

The first line 210 of the dual delay line only varies the delay time of the first delay signal 'CLK_in_dlyU1' according to the second control signals 'SU0' to 'SU4' and outputs the third delay signal 'CLK_in_dlyU2'

Since the delay is locked after the increasing of the delay time (B) corresponding to two unit delayers UD2, which are taken from the initial unit delayer UD2 (A), it is not required to operate the first delay circuit unit 100.

Figure 6:
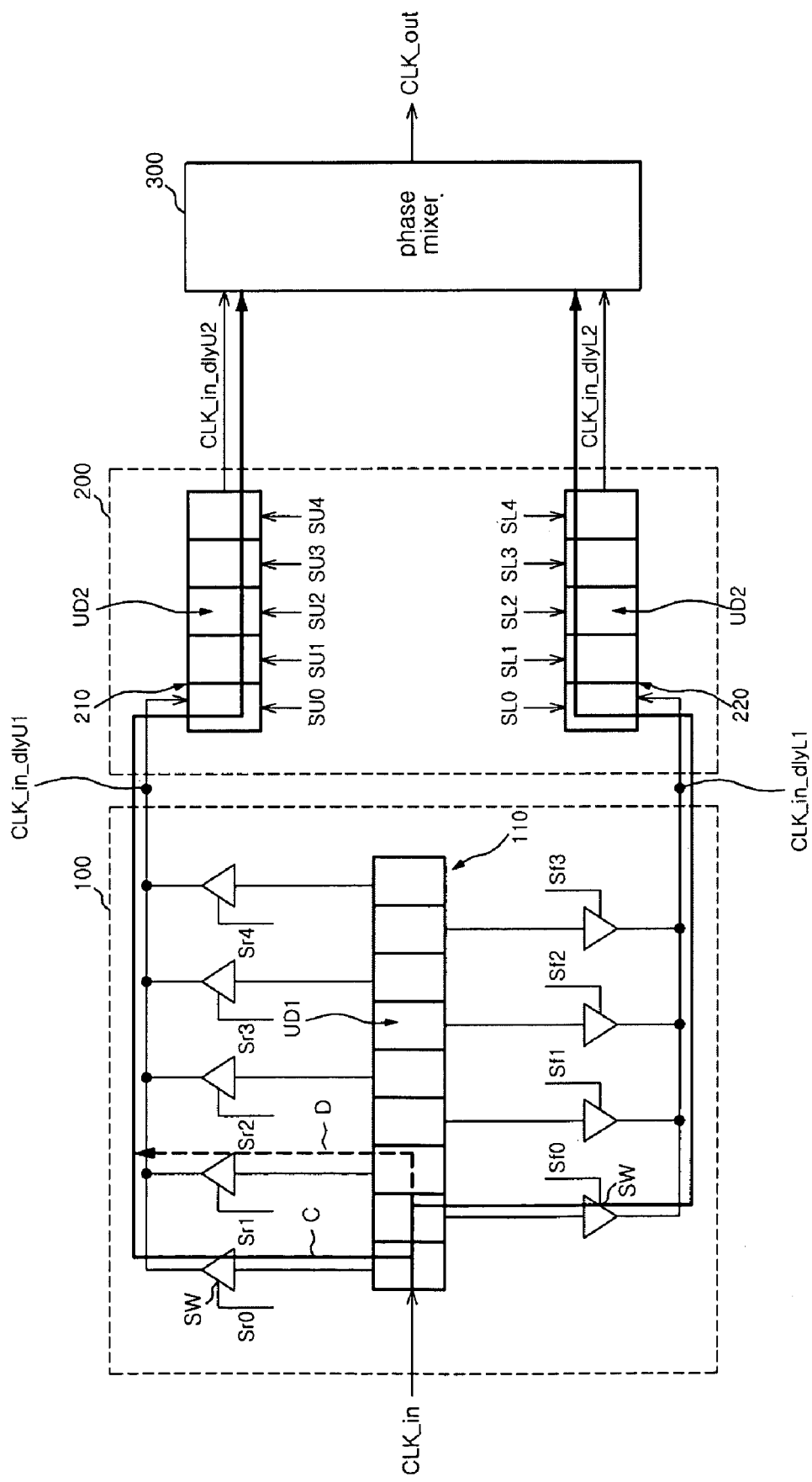
FIG. 6 is a block diagram illustrating another method for controlling the delay circuit of the delay locked loop of FIG. 3 according to another embodiment.

Meanwhile, a delay circuit configured as described herein makes it possible to achieve the locking operation in the delay locked loop by operating the first delay circuit unit 100 and the second delay circuit unit 200 in a predetermined order. In case that the delay locking is not achieved by the maximum delay time of the dual delay line (210 and 220) in the second delay circuit unit 200, the first circuit unit 100 executes the delay locking operation and this operation will be described in FIG. 6.

Initially, the first control signals 'Sr0', 'Sf0', ..., 'Sf3' and 'Sr4' are fixed to a specific value in order that the first delay signal 'CLK_in_dlyU1' and the second signal 'CLK_in_dlyL1' have a minimum delay time.

Accordingly, the first circuit unit 100 outputs the first delay signal 'CLK_in_dlyU1', which has the minimum delay time corresponding to the delay time of one unit delayer UD1. Furthermore, the first circuit unit 100 outputs the second delay signal 'CLK_in_dlyL1' which has a delay time corresponding to two unit delayers UD1.

Next, the dual delay line (210 and 220) changes the first delay signal 'CLK_in_dlyU1' and the second delay signal 'CLK_in_dlyL1' into the third delay signal 'CLK_in_dlyU2' and the fourth delay signal 'CLK_in_dlyL2', by adjusting the second control signals 'SU0' to 'SU4' and the third control signals 'SL0' to 'SL4', respectively.

Since the delay is not locked by the maximum delay time of the dual delay line (210 and 220), the second control signals 'SU0' to 'SU4' and the third control signals 'SL0' to 'SL4' are fixed and the first control signals 'Sr0', 'Sf0', ..., 'Sf3' and 'Sr4' are adjusted.

The single delay line 110 delays the input signal 'CLK_in' by a variable delay time according to the first control signals 'Sr0', 'Sf0', ..., 'Sf3' and 'Sr4', thereby outputting the first delay signal 'CLK_in_dlyU1' and the second delay signal 'CLK_in_dlyL1'.

The dual delay line (210 and 220) delays the first delay signal 'CLK_in_dlyU1' and the second delay signal 'CLK_in_dlyL1' by the maximum delay time and then outputs the third delay signal 'CLK_in_dlyU2' and the fourth delay signal 'CLK_in_dlyL2' to the phase mixer 300.

The delay is locked after the delay time (D) corresponding to two unit delayers UD1 which are taken from the initial unit delayer UD1 (C).

While certain embodiments have been described above, it will be understood that the embodiments described are by way of example only. For example, the delay locking operation is executed by varying the delay time in the first delay circuit unit 100. That is, in case that the delay is not locked by the maximum delay time in the first delay circuit unit 100, the delay time of the second delay circuit unit 200 can be varied. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A delay circuit in a delay locked loop comprising:
a first delay circuit unit configured to delay an input signal using a single delay line in response to first control signals and then outputting a first delay signal and a second delay signal; and
a second delay circuit unit coupled with the first delay circuit, the second delay circuit configured to delay the first delay signal and the second delay signal by delay time, which corresponds to second control signals and third control signals, using a dual delay line and then outputting a third delay signal and a fourth delay signal,
wherein the first delay circuit unit includes: a plurality of first unit delayers configured to form the single delay line; and a plurality of switching elements coupled to the plurality of first unit delayers, wherein the first delay circuit unit is further configured to output the first delay signal and the second delay signal in order that the first delay signal differs from the second delay signal in delay time, and wherein the delay time difference between the first delay signal and the second delay signal corresponds to the delay of at least one of the first unit delayers.

2. The delay circuit of claim 1, wherein the plurality of switching elements transfer output signals of the first unit delayers, as the first and second delay signal, in response to the first control signals.

3. The delay circuit of claim 2, wherein the plurality of switching elements include first and second switching groups and wherein the switching elements of the first switching group are alternately coupled to the first unit delayers and configured to output the first delay signal in response to a part of the first control signals.

4. The delay circuit of claim 3, wherein the switching elements of the second switching group are alternately coupled to the first unit delayers and configured to output the second delay signal in response to another part of the first control signals.

5. The delay circuit of claim 1, wherein the dual delay line includes:
    a first delay line configured to output the third delay signal by delaying the first delay signal in response to the second control signals; and
    a second delay line configured to output the fourth delay signal by delaying the second delay signal in response to the third control signals.

6. The delay circuit of claim 5, wherein each of the first and second delay line includes a plurality of second unit delayers, and wherein the second unit delayers are smaller in number than the first unit delayers.

7. The delay circuit of claim 6, wherein a delay time of each second unit delayer is shorter than that of each first unit delayer.

8. The delay circuit of claim 1, further comprising a phase mixer for mixing phases of the third and fourth delay signals.

9. A method for controlling a delay circuit in a delay locked loop, wherein the delay circuit includes a first delay circuit unit for outputting a first delay signal and a second delay signal by delaying an input signal and a second delay circuit unit for outputting a third delay signal and a fourth delay signal by delaying the first delay signal and the second delay signal, the method comprising:
    outputting the first delay signal and the second delay signal in a state where a delay time of the first delay circuit unit is fixed;
    executing a delay locking operation by varying a delay time of the second delay circuit unit to output the third delay signal and the fourth delay signal; and
    varying the delay time of the first circuit unit when a delay is not locked by a maximum delay time of the second delay circuit unit,
    wherein the delay time of the first delay signal is different from that of the second delay signal, and
    wherein the first delay signal is outputted from odd-numbered unit delayers of a plurality of unit delayers in a single delay line of the first delay circuit unit and wherein the second delay signal is outputted from even-numbered unit delayers of the plurality of unit delayers in the single delay line of the first delay circuit unit.

10. The method of claim 9, wherein a unit delay time in the first delay circuit unit is different from that in the second delay circuit unit.

11. The method of claim 10, wherein the unit delay time in the first delay circuit unit is longer than that in the second delay circuit unit.

12. The method of claim 9, wherein the second delay circuit includes a dual delay line to receive the first delay signal and the second delay signal and wherein the third delay signal and the fourth delay signal, which are outputted at an initial time, are delayed signals which are generated by delaying the first delay signal and the second delay signal through the dual delay line.

* * * * *